(12) United States Patent
Gonikberg et al.

(10) Patent No.: US 8,391,808 B2
(45) Date of Patent: Mar. 5, 2013

(54) METHOD AND SYSTEM FOR ESTIMATING AND COMPENSATING NON-LINEAR DISTORTION IN A TRANSMITTER USING CALIBRATION

(75) Inventors: Mark Gonikberg, Los Altos Hills, CA (US); Luis Gutierrez, San Francisco, CA (US); Colin Fraser, Mountain View, CA (US); Arya Behzad, Poway, CA (US); George Varghese, Kottayam District (IN)

(73) Assignee: Broadcom Corporation, Irvine, CA (US)

( * ) Notice: Subject to any disclaimer, the term of this patent is extended or adjusted under 35 U.S.C. 154(b) by 843 days.

(21) Appl. No.: 12/038,996

(22) Filed: Feb. 28, 2008

(65) Prior Publication Data
US 2009/0221245 A1 Sep. 3, 2009

(51) Int. Cl.
*H04B 1/04* (2006.01)
(52) U.S. Cl. .................. 455/114.3; 455/126; 375/297
(58) Field of Classification Search ............... 455/114.3, 455/126, 114.2; 375/296, 297
See application file for complete search history.

(56) References Cited

U.S. PATENT DOCUMENTS

| | | | | |
|---|---|---|---|---|
| 5,903,611 A * | 5/1999 | Schnabl et al. | ................ | 375/297 |
| 6,029,285 A * | 2/2000 | Belcher et al. | ................ | 330/149 |
| 6,396,345 B2 * | 5/2002 | Dolman | ........................ | 330/149 |
| 6,449,466 B1 * | 9/2002 | Jin et al. | ..................... | 455/127.2 |
| 6,693,974 B2 * | 2/2004 | Jin et al. | ......................... | 375/297 |
| 6,836,517 B2 * | 12/2004 | Nagatani et al. | .............. | 375/296 |
| 6,928,272 B2 * | 8/2005 | Doi | ............. | 455/114.2 |
| 7,068,980 B2 * | 6/2006 | Seo et al. | ........................ | 455/91 |
| 7,289,776 B2 * | 10/2007 | Matsuoka et al. | ............ | 455/126 |
| 7,321,264 B2 * | 1/2008 | Kokkeler | ....................... | 330/149 |
| 7,321,635 B2 * | 1/2008 | Ocenasek et al. | .............. | 375/297 |
| 7,551,905 B2 * | 6/2009 | Kubo et al. | ..................... | 455/126 |
| 7,561,856 B2 * | 7/2009 | Watabe et al. | ............. | 455/114.3 |
| 7,577,211 B2 * | 8/2009 | Braithwaite | .................. | 375/296 |
| 7,580,686 B2 * | 8/2009 | Fonden et al. | ............. | 455/114.2 |
| 7,620,373 B2 * | 11/2009 | Cole et al. | ........................ | 455/73 |
| 7,627,293 B2 * | 12/2009 | Bhandari et al. | ............ | 455/114.3 |
| 7,634,024 B2 * | 12/2009 | Tan | ................. | 375/297 |
| 7,751,786 B2 * | 7/2010 | McCallister et al. | ....... | 455/115.1 |
| 7,809,080 B2 * | 10/2010 | Bhandari et al. | .............. | 375/296 |
| 2001/0007435 A1 * | 7/2001 | Ode et al. | ....................... | 330/149 |
| 2001/0051504 A1 * | 12/2001 | Kubo et al. | ..................... | 455/63 |
| 2005/0079834 A1 * | 4/2005 | Maniwa et al. | ............. | 455/114.3 |
| 2005/0164656 A1 * | 7/2005 | Watabe et al. | ............. | 455/114.3 |
| 2006/0240786 A1 * | 10/2006 | Liu | ................. | 455/114.3 |
| 2008/0139141 A1 * | 6/2008 | Varghese et al. | ............ | 455/114.3 |

* cited by examiner

*Primary Examiner* — Edward Urban
*Assistant Examiner* — Rui Hu
(74) *Attorney, Agent, or Firm* — Thomas|Horstemeyer, LLP

(57) ABSTRACT

Aspects of a method and system for estimating and compensating for non-linear distortion in a transmitter using calibration are presented. Aspects of the system may include one more circuits that may enable estimation, within a single IC device, of distortion in output signals generated by a transmitter circuit. The circuitry may enable compensation of the estimated distortion by predistorting subsequent input signals. The transmitter circuit may generate subsequent output signals based on the predistorted subsequent input signals.

27 Claims, 6 Drawing Sheets

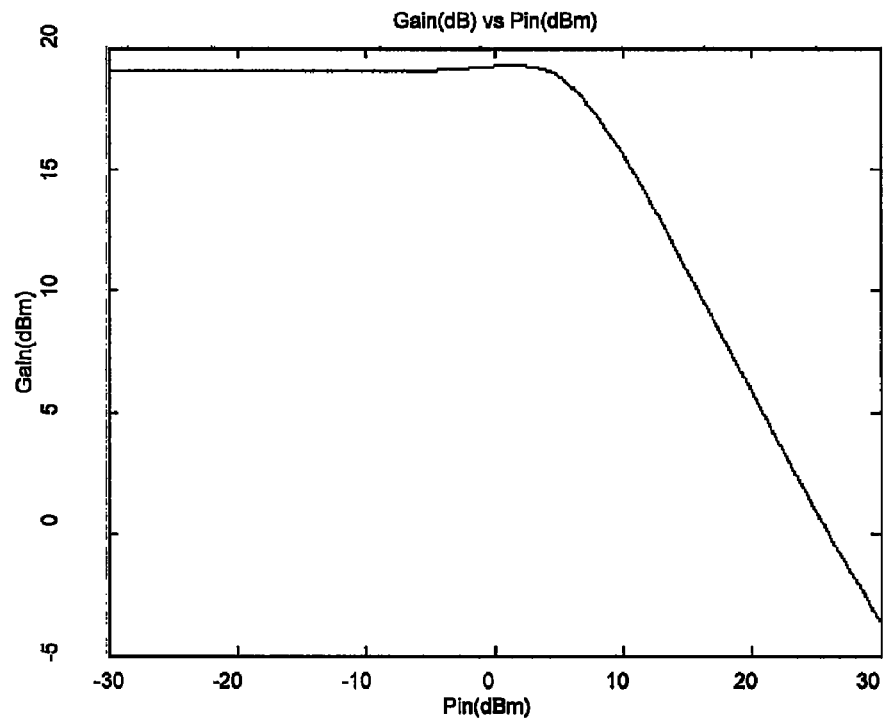
FIG. 2A
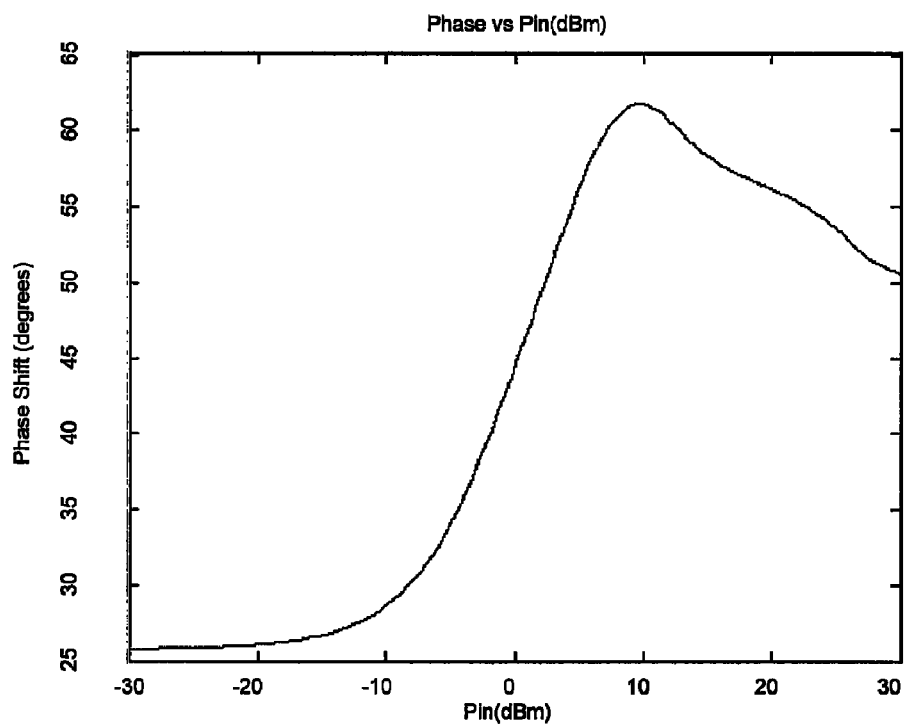
FIG. 2B
FIG. 2

METHOD AND SYSTEM FOR ESTIMATING AND COMPENSATING NON-LINEAR DISTORTION IN A TRANSMITTER USING CALIBRATION

CROSS-REFERENCE TO RELATED APPLICATIONS/INCORPORATION BY REFERENCE

Not Applicable

FIELD OF THE INVENTION

Certain embodiments of the invention relate to wireless communications. More specifically, certain embodiments of the invention relate to a method and system for estimating and compensating for non-linear distortion in a transmitter using calibration.

BACKGROUND OF THE INVENTION

A power amplification circuit in a wireless system is typically a large signal device. In wireless local area network (WLAN) systems, the power amplifier circuit may transmit output signals at average power levels in the range of 10 dBm to 21 dBm, and peak power levels of about 25 dBm, for example. In WLAN systems, which use orthogonal frequency-division multiplexing (OFDM) or complementary code keying (CCK) modulation, output power levels may vary widely such that the ratio of the peak power level to the average power level may be large, for example, 12 dB for OFDM and 6 dB for CCK. Because of these large swings in output power levels, power amplifier (PA) circuits may distort the output signal. Distortion, however, is a characteristic, which may be observed in PA circuits that are utilized across a wide range of applications, and may not be limited to PA circuits utilized in wireless systems. There are two metrics, which may be utilized to evaluate the distortion performance of PA circuits. These metrics may be referred to as amplitude modulation to amplitude modulation (AM-AM) distortion, and amplitude modulation to phase modulation (AM-PM) distortion.

The AM-AM distortion provides a measure of the output power level, $p_{out}$, in response to the input power level, $p_{in}$. In an ideal, non-distorting, PA circuit, the output power level changes linearly in response to a change in the input power level. The AM-AM distortion may be observed when, for example, the output power level does not change linearly in response to change in the input power level.

The AM-PM distortion provides a measure of the phase of the output signal in relation to the phase of the input signal (or phase change) in response to the input power level. The AM-PM distortion may be observed when, for example, the input to output phase-change varies in response to a change in input power level.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for estimating and compensating for non-linear distortion in a transmitter using calibration, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 2A is a chart that illustrates exemplary AM-AM distortion in power amplifier circuitry, which may be utilized in connection with an embodiment of the invention.

FIG. 2B is a chart that illustrates exemplary AM-PM distortion in power amplifier circuitry, which may be utilized in connection with an embodiment of the invention.

DETAILED DESCRIPTION OF THE INVENTION

Certain embodiments of the invention may be found in a method and system for estimating and compensating for nonlinear distortion in a transmitter using calibration. Various embodiments of the invention may comprise a single IC chip, which contains power amplifier circuitry (PA) in addition to circuitry for compensating for nonlinearity in the PA circuitry. Nonlinearity in the PA circuitry may be measured by AM-AM distortion and/or AM-PM distortion, for example. In various embodiments of the invention, AM-AM distortion may be determined by sending a range of input power levels, $p_{in}$, to the PA circuitry and measuring the corresponding range of output power levels, $p_{out}$, from the PA circuitry. The input power level may measure a radio frequency (RF) signal, which may be generated from a baseband signal. The baseband signal may comprise an In-Phase component, $I_{BB}$, and a Quadrature-Phase component $Q_{BB}$. In one aspect of the invention, AM-PM distortion may be measured by estimating a time delay from the input of the $p_{in}$ signal to the PA circuitry to the output of the corresponding $p_{out}$ signal. In another aspect of the invention, AM-PM distortion may be measured by estimating a relative change in the phase relationship between the corresponding baseband component signals $I_{BB}$ and $Q_{BB}$.

Figure 1:
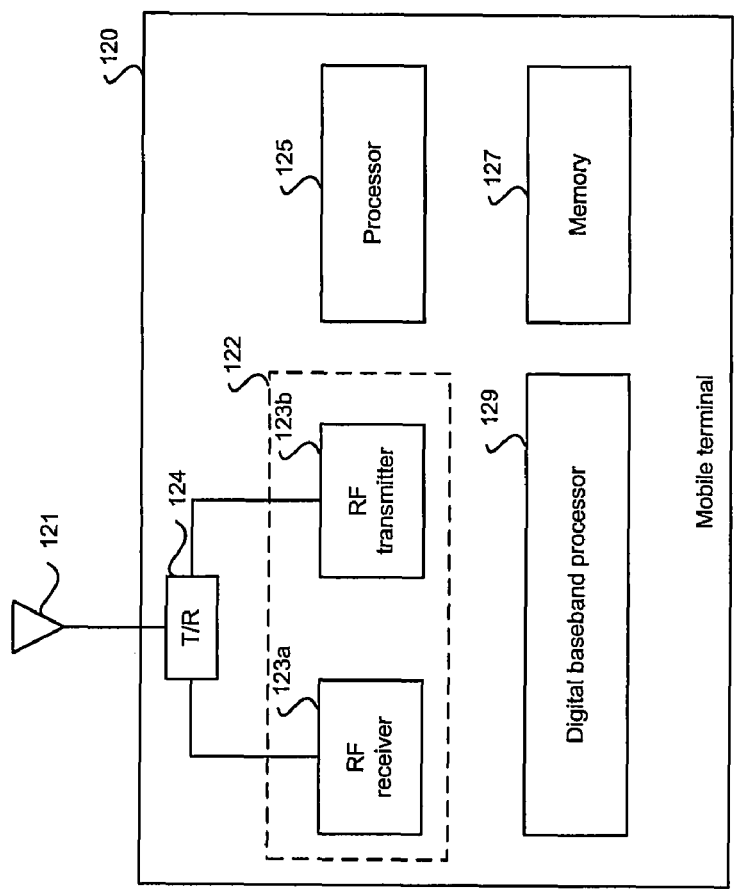
FIG. 1 is a block diagram illustrating an exemplary mobile terminal, which may be utilized in connection with an embodiment of the invention.

FIG. 1 is a block diagram illustrating an exemplary mobile terminal, which may be utilized in connection with an embodiment of the invention. Referring to FIG. 1, there is shown mobile terminal 120 that may comprise an RF receiver 123a, an RF transmitter 123b, a digital baseband processor 129, a processor 125, and a memory 127. In some embodiments of the invention, the RF receiver 123a, and RF transmitter 123b may be integrated into an RF transceiver 122, for example. A single transmit and receive antenna 121 may be communicatively coupled to the RF receiver 123a and the RF transmitter 123b. A switch 124, or other device having switching capabilities may be coupled between the RF receiver 123a and RF transmitter 123b, and may be utilized to switch the antenna 121 between transmit and receive functions.

The RF receiver 123a may comprise suitable logic, circuitry, and/or code that may enable processing of received RF signals. The RF receiver 123a may enable receiving RF signals in frequency bands utilized by various wireless communication systems, such as WLAN, Bluetooth, global system for mobile communications (GSM) and/or code division multiple access, for example.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b for transmission via a wireless communication medium. The digital baseband processor 129 may also provide control and/or feedback information to the RF receiver 123a and to the RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or the memory 127, which may be processed and transferred to the RF transmitter 123b for transmission via the wireless communication medium.

The RF transmitter 123b may comprise suitable logic, circuitry, and/or code that may enable processing of RF signals for transmission. The RF transmitter 123b may enable transmission of RF signals in frequency bands utilized by various wireless communications systems, such as GSM and/or CDMA, for example. The RF transmitter 123b may contain PA circuitry, which may exhibit AM-AM and/or AM-PM distortion within its operating range.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, which may be utilized to control the operation of at least one block in the mobile terminal 120. For example, the memory 127 may comprise information necessary to configure the RF receiver 123a to enable receiving RF signals in the appropriate frequency band.

FIG. 2A is a chart that illustrates exemplary AM-AM distortion in power amplifier circuitry, which may be utilized in connection with an embodiment of the invention. Referring to FIG. 2A, the horizontal axis presents input power levels, $P_{in}$, measured in units of decibels relative to 1 miliwatt (dBm). The input levels as shown in FIG. 2A range from −30 dBm to 30 dBm. The vertical axis presents Gain, measured in decibels (dB), which may be determined based on the ratio of output power levels, $P_{out}$, to $P_{in}$.

As shown in FIG. 2A, the Gain level is approximately constant, at about 18 dB, over the range of levels $P_{in}$ from about −30 dBm to about 5 dBm. The range of levels −30 dBm≦$P_{in}$≦5 dBm may correspond to the linear operating range for the PA circuitry. Over the range of levels $P_{in}$>5 dBm, the Gain level is shown to decrease with increasing levels $P_{in}$. This range may correspond to a nonlinear operating range for the PA circuitry, and the decreasing Gain levels as a function of increasing levels $P_{in}$, $g(P_{in})$, may be indicative of AM-AM distortion.

FIG. 2B is a chart that illustrates exemplary AM-PM distortion in power amplifier circuitry, which may be utilized in connection with an embodiment of the invention. Referring to FIG. 2B, the horizontal axis presents input power levels, $P_{in}$, measured in units of decibels relative to 1 milliwatt (dBm). The input levels as shown in FIG. 2A range from −30 dBm to 30 dBm. The vertical axis presents Phase Shift, measured in degrees (°), which may be determined based on the phase difference between the $P_{out}$ signal, measured at the output of the PA and the $P_{in}$ signal, measured at the input of the PA.

As shown in FIG. 2B, the Phase Shift level is approximately constant, at about 25°, over the range of levels $P_{in}$ from about −30 dBm to about −10 dBm. Over the range of levels $P_{in}$>−10 dBm, the Phase Shift level is shown to vary with increasing levels $P_{in}$. The variations in Phase Shift with increasing levels $P_{in}$, $\phi_\Delta(P_{in})$, may be indicative of AM-PM distortion.

Figure 3:
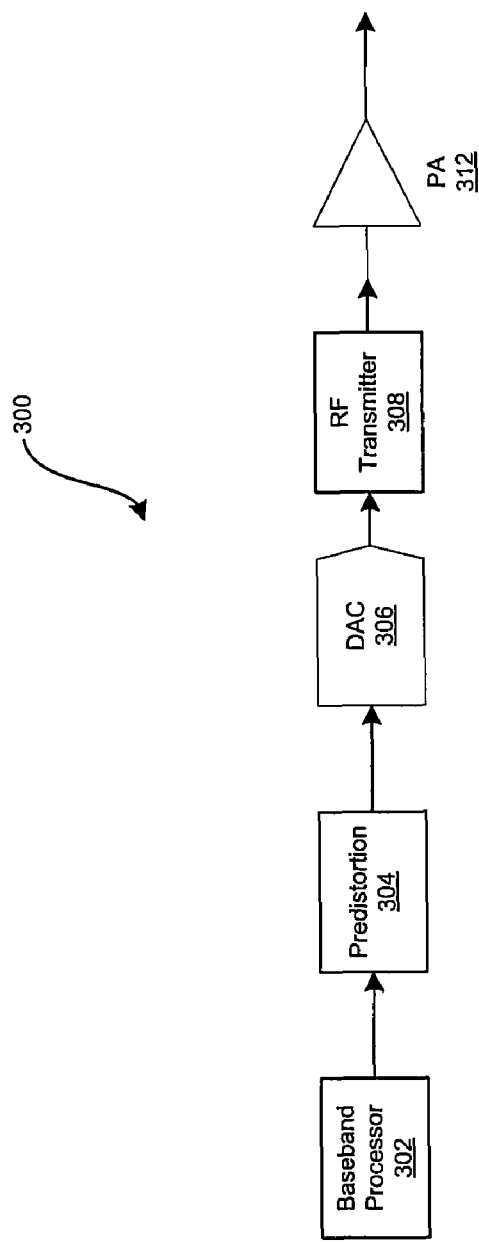
FIG. 3 is an exemplary block diagram illustrating a single chip wireless transmitter with compensation for nonlinear distortion, in accordance with an embodiment of the invention.

FIG. 3 is an exemplary block diagram illustrating a single chip wireless transmitter with compensation for nonlinear distortion, in accordance with an embodiment of the invention. Referring to FIG. 3, there is shown a single chip RF transmitter 300. The single chip RF transmitter 300 may comprise a baseband processor 302, a predistortion block 304, a digital-to-analog converter (DAC) block 306, an RF transmitter 308 and a power amplifier (PA) 312.

The baseband processor 302 may comprise suitable logic, circuitry and/or code that may enable generation of baseband signals. The baseband signals may be represented in digital form and may comprise $I_{BB}$ and $Q_{BB}$ signal components.

The predistortion block 304 may comprise suitable logic, circuitry and/or code that may enable compensation for nonlinear distortion introduced by the PA 312. The predistortion block 304 may enable compensation for nonlinear distortion by applying predistortion to an input baseband signal to generate a predistorted baseband signal. In this regard, the applied predistortion may comprise a gain predistortion function, $g_{PD}(P_{in})$, and a phase shift predistortion function, $\phi_{PD}(P_{in})$. With reference to the exemplary Gain function shown in FIG. 2A, the gain predistortion function may represented by the following relationship:

$$g_{PD}(P_{in})=1 \qquad [1a]$$

for −30 dBm≦$P_{in}$≦5 dBm, and:

$$g_{PD}(P_{in}) = \frac{g_{lin}}{g(g_{PD}(P_{in}) \cdot P_{in})} \qquad [1b]$$

for $P_{in}$>5 dBm, where $g_{lin}$ represents the gain of the PA 312 across the linear operating region. The PA 312 gain, $g(P_{in})$, may be represented by the following relationship:

$$g(P_{in}) = \frac{P_{out}}{P_{in}} \qquad [1c]$$

for an input power level to the PA 312, $P_{in}$, and an output power level from the PA 312, $P_{out}$.

With reference to equation [1a], no gain predistortion may be applied to the input baseband signal when the PA 312 gain is substantially linear across a range of $P_{in}$ levels. With reference to equation [1b], gain predistortion may be applied to the input baseband signal when the PA 312 gain is nonlinear across a range of $P_{in}$ values. The gain predistortion may be in proportion to the nonlinearity of the PA 312 gain to enable compensation for AM-AM distortion in the PA 312. Thus, for a given input baseband signal to the predistortion block 304, $s_{BB}$, a corresponding gain-predistorted baseband signal output from the predistortion block 304, $\hat{s}_{BB}$, may be represented by the following relationship:

$$\hat{s}_{BB} = g_{PD}(P_{in}) \cdot s_{BB} \quad [2]$$

In various embodiments of the invention, the phase shift predistortion function, $\phi_{PD}(P_{in})$, may be additive to the Phase Shift function, $\phi_\Delta(P_{in})$, such that the sum is a substantially constant value as shown in the following equation:

$$\phi_\Delta(P_{in}) + \phi_{PD}(P_{in}) = \phi_{const} \quad [3a]$$

where $\phi_{const}$ represents a reference phase shift value. Thus, a phase shift predistortion function, which may enable compensation for AM-PM distortion in the PA 312, may be represented as follows:

$$\phi_{PD}(P_{in}) = \phi_{const} - \phi_\Delta(P_{in}) \quad [3b]$$

With reference to the exemplary Phase Shift function shown in FIG. 2B, in an exemplary embodiment of the invention in which $\phi_{const} = 45°$, the phase predistortion applied to the input baseband signal may be represented by values:

$$\phi_{PD}(P_{in}) > 0 \quad [4a]$$

for $P_{in} < 0$ dBm and values:

$$\phi_{PD}(P_{in}) < 0 \quad [4b]$$

for $P_{in} > 0$ dBm.

In various embodiments of the invention, phase shift predistortion may comprise altering the relative phase relationship between the input baseband signal components $I_{BB}$ and $Q_{BB}$. The amount of relative phase alteration may be determined based on equation [3b], for example. The relative phase shift alteration may comprise alteration of the amplitude $\|I_{BB}\|$ relative to the amplitude $\|Q_{BB}\|$, for example.

The DAC 306 may comprise suitable logic, circuitry, and/or code that may enable conversion of an input digital signal to a corresponding output analog signal representation. The RF transmitter 308 may comprise suitable logic, circuitry and/or code that may enable amplification of input signals to generate an amplified output signal. The amplified output signal may also be filtered, for example by a low pass filter (LPF). The RF transmitter 308 may be utilized in multistage amplifier systems wherein the output of the RF transmitter 308 may be an input to a subsequent amplification stage.

The PA 312 may comprise suitable logic, circuitry and/or code that may enable amplification of input signals, $RF_{in}$, to generate output signals, $RF_{out}$, of sufficient signal power (as measured by dBm, for example) for transmission via a wireless communication medium. The relationship between the input signal and the output signal may be represented as in the following equation:

$$RF_{out} = g(P_{in}) \cdot RF_{in} \quad [5]$$

where $P_{in}$ may represent the input power level for the input signal $RF_{in}$. The PA 312 gain, $g(P_{in})$, may be constant with respect to $P_{in}$ across a linear portion of the operating range of the PA 312, and variable with respect to $P_{in}$ across a nonlinear portion of the operating range. For example, with reference to FIG. 2A, $g(P_{in}) = g_{lin}$ for the range of input power levels $-30$ dBm $\leq P_{in} \leq 5$ dBm. For input power levels higher than 5 dBm, $g(P_{in})$ may decrease with increasing levels $P_{in}$ as shown in FIG. 2A.

In an exemplary embodiment of the invention showing compensation for AM-AM distortion, the analog output signal, $RF_{out}$, from the PA 312 may be substantially represented as a function of the digital input signal $s_{BB}$ from the baseband processor 302 (after digital-to-analog conversion) as shown in the following equation:

$$RF_{out} \stackrel{DAC}{\longleftarrow} g(P_{in}) \cdot g_{PD}(P_{in}) \cdot s_{BB} \quad [6a]$$

where the corresponding input signal to the PA 312, $RF_{in}$, may be represented by the following relationship:

$$RF_{in} \stackrel{DAC}{\longleftarrow} g_{PD}(P_{in}) \cdot s_{BB} \quad [6b]$$

With reference to FIG. 2A, for the input power level range $-30$ dBm $\leq 5 \leq P_{in} \leq 5$ dBm (measured at the input of the PA 312):

$$RF_{out} \stackrel{DAC}{\longleftarrow} g_{lin} \cdot 1 \cdot s_{BB} \quad [7]$$
$$RF_{out} \stackrel{DAC}{\longleftarrow} g_{lin} \cdot s_{BB}$$

for the input power level range $P_{in} > 5$ dBm:

$$RF_{out} \stackrel{DAC}{\longleftarrow} g(P_{in}) \cdot \frac{g_{lin}}{g(P_{in})} \cdot s_{BB} \quad [8]$$
$$RF_{out} \stackrel{DAC}{\longleftarrow} g_{lin} \cdot s_{BB}$$

In an exemplary embodiment of the invention showing compensation for AM-PM distortion, the phase of the analog output signal, $RF_{out}$, from the PA 312 may be represented as $\phi(P_{out})$ and the phase of the analog input signal, $RF_{in}$, to the PA 312 may be represented as $\phi(P_{in})$. The relative phase shift function $\phi_\Delta(P_{in})$ may be represented by the following relationship:

$$\phi_\Delta(P_{in}) = \phi(P_{out}) - \phi(P_{in}) \quad [9]$$

The corresponding phase shift predistortion function, which may enable compensation for AM-PM distortion, may be represented by the following relationship:

$$\phi_{PD}(P_{in}) = \phi_{const} - \phi(P_{out}) + \phi(P_{in}) \quad [10]$$

Equations [4]-[10] present an exemplary method for compensating nonlinear distortion in a transmitter, in accordance with an embodiment of the invention. The nonlinear distortion compensation may comprise a gain predistortion function and/or a phase shift predistortion function.

In various embodiments of the invention, the predistortion function may comprise a gain predistortion function, $g_{PD}(P_{in})$, and a phase shift predistortion function, $e^{j \cdot \phi_{PD}(P_{in})}$, which may be applied to the $I_{BB}$ and $Q_{BB}$ components of the input baseband signal to generate predistorted signal components, $I_{PD}$ and $Q_{PD}$ as shown in the following equation:

$$I_{PD} = Re\{g_{PD}(P_{in}) \cdot e^{j \cdot \phi_{PD}(P_{in})} \cdot (I_{BB} + j \cdot Q_{BB})\}$$

$$Q_{PD} = Im\{g_{PD}(P_{in}) \cdot e^{j \cdot \phi_{PD}(P_{in})} \cdot (I_{BB} + j \cdot Q_{BB})\} \quad [11]$$

Based on equation [11] a gain factor, $g(P_{in})$, may be determined, which may be computed based on the gain predistortion function and the phase shift predistortion function:

$$g(P_{in}) = g_{PD}(P_{in}) \cdot e^{j \cdot \phi_{PD}(P_{in})} \quad [12]$$

Figure 4:
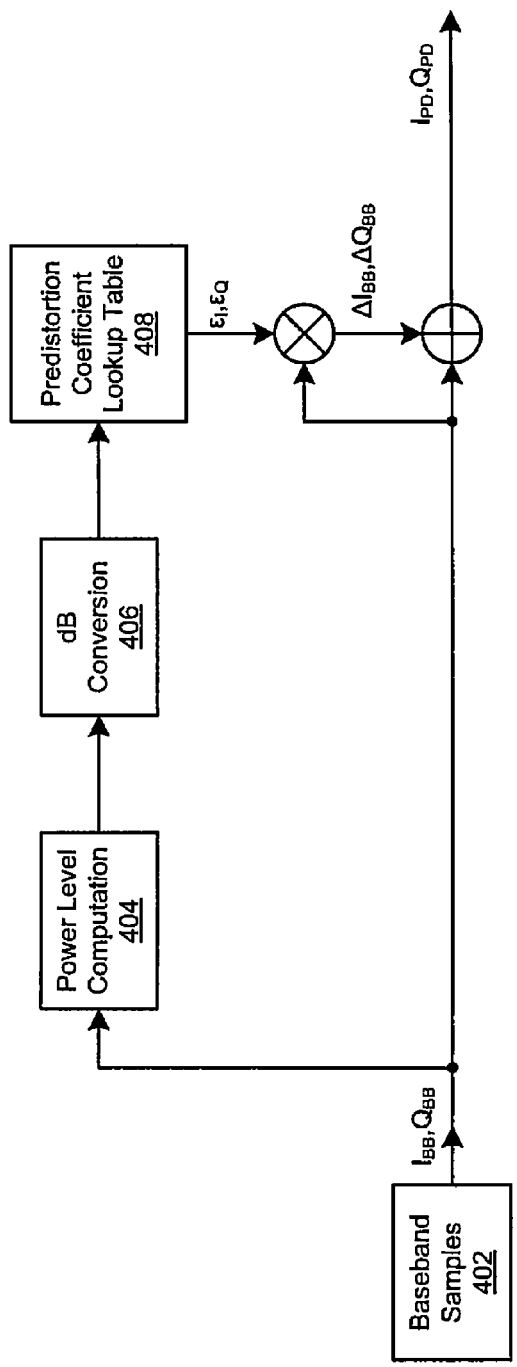
FIG. 4 is an exemplary block diagram illustrating a system for estimating and compensating for nonlinear distortion in a transmitter using calibration, in accordance with an embodiment of the invention.

FIG. 4 is an exemplary block diagram illustrating a system for estimating and compensating for nonlinear distortion in a transmitter using calibration, in accordance with an embodiment of the invention. Referring to FIG. 4, there is shown a baseband samples block 402, a power level computation block 404, a dB conversion block 406 and a predistortion coefficient lookup table block 408.

The baseband samples block 402 may comprise suitable logic, circuitry and/or code that may allow generation of a digital baseband signal. The digital baseband signal may comprise I component samples, $I_{BB}$, and Q component samples, $Q_{BB}$.

The power level computation block 404 may comprise suitable logic, circuitry and/or code that may enable computing an input power level, $P_{in}$, based on received input baseband samples $I_{BB}$ and $Q_{BB}$. The power level may be computed by computing values $\|I_{BB}\|^2$ and $\|Q_{BB}\|^2$, for example. In an exemplary embodiment of the invention, the computed power level may be expressed in units of milliwatts (mW).

The dB conversion block 406 may comprise suitable logic, circuitry and/or code that may enable conversion of an input power level, as expressed for example in units of mW, to units of dB or dBm.

The predistortion coefficient lookup table block 408 may comprise suitable logic, circuitry and/or code that may enable determining a predistortion coefficient value, $\epsilon$, based on a received input power level expressed, for example, in dBm. The joint action of the gain predistortion function and phase shift predistortion function may enable modification of individual components, $I_{BB}$ and $Q_{BB}$, in the input baseband signal.

In operation, the baseband samples, $I_{BB}$ and $Q_{BB}$, output from the baseband samples block 402 may be multiplied the by predistortion coefficient, $\epsilon$, to compute predistortion correction values, $\Delta I_{BB}$ and $\Delta Q_{BB}$, as shown in the following exemplary equations:

$$\Delta I_{BB} = Re\{\epsilon \cdot (I_{BB} + j \cdot Q_{BB})\}$$

$$\Delta Q_{BB} = Im\{\epsilon \cdot (I_{BB} + j \cdot Q_{BB})\} \quad [13]$$

The predistortion correction values may then be added to the baseband samples to generate predistorted samples, $I_{PD}$ and $Q_{PD}$, as shown in the following exemplary equations:

$$I_{PD} = I_{BB} + \Delta I_{BB}$$

$$Q_{PD} = Q_{BB} + \Delta Q_{BB} \quad [14]$$

The predistorted samples may be represented as in the following equation:

$$I_{PD} = Re\{g(P_{in}) \cdot (I_{BB} + Q_{BB})\}$$

$$Q_{PD} = Im\{g(P_{in}) \cdot (I_{BB} + Q_{BB})\} \quad [15]$$

In this regard, the gain factor, $g(P_{in})$, (as shown in equation [12]) may be represented as a function of the predistortion coefficient as shown in the following equation:

$$g(P_{in}) = 1 + \epsilon \quad [16]$$

In various embodiments of the invention, the predistorted samples, $I_{PD}$ and $Q_{PD}$, may comprise compensation for nonlinear distortion PA 312, for example. The compensation may comprise adjustments in response to AM-AM distortion and/or AM-PM distortion. When the PA 312 is operating in the linear operating region, the predistortion coefficient values, $\epsilon$, may be equal to 0, for example. In this case, the predistortion correction values, $\Delta I_{BB}$ and $\Delta Q_{BB}$, may also equal 0. Consequently, the predistorted samples, $I_{PD}$ and $Q_{PD}$, may be equal to the corresponding input baseband samples, $I_{BB}$ and $Q_{BB}$.

In various embodiments of the invention, the representation of the gain factor, $g(P_{in})$, as shown in equation [16] may enable avoidance of a loss of resolution in the computation of values for the gain factor when the values of $\epsilon$ are small in comparison to 1.

Figure 5:
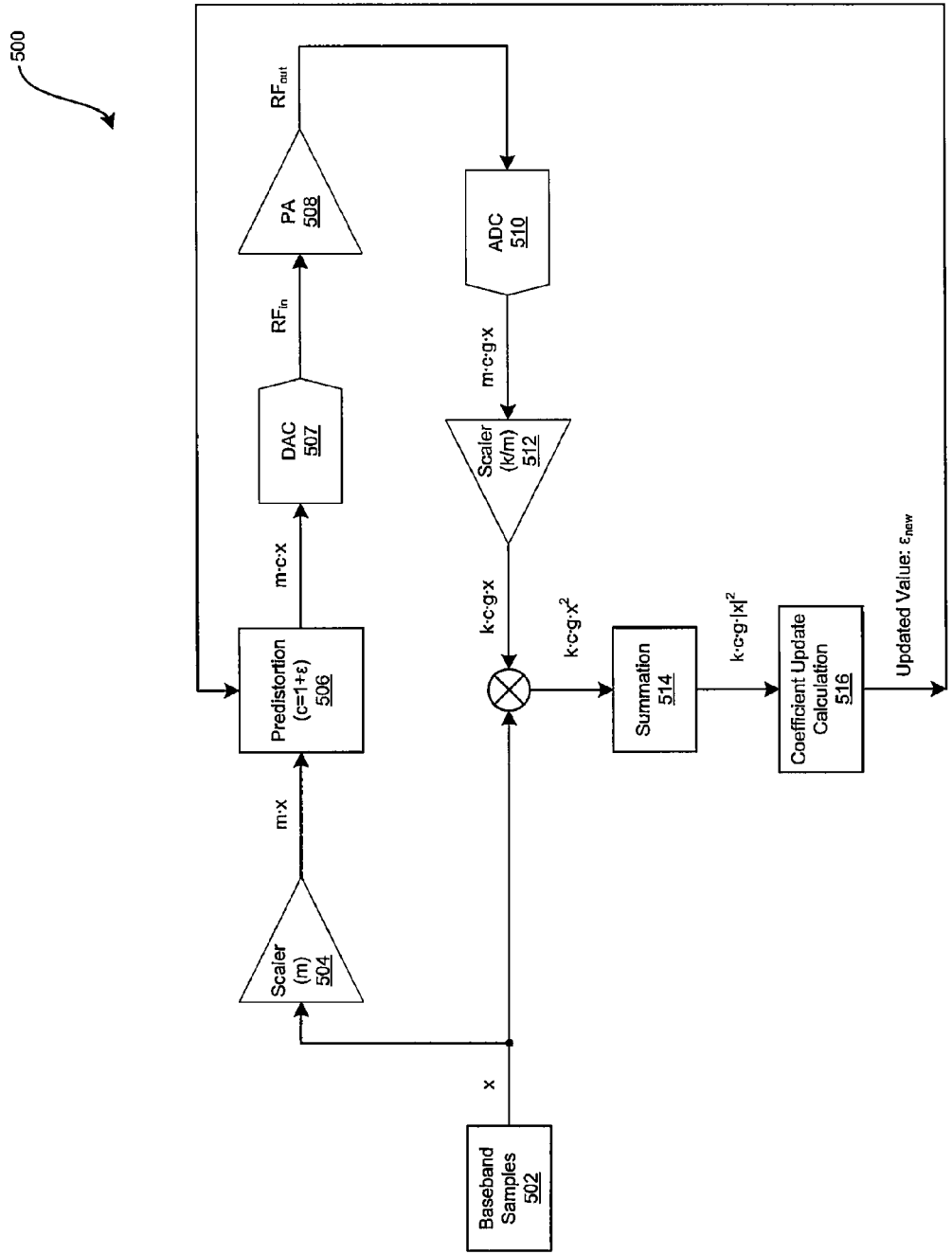
FIG. 5 is a block diagram of an exemplary system for estimating and compensating for nonlinear distortion in a transmitter using calibration, in accordance with an embodiment of the invention.

FIG. 5 is a block diagram of an exemplary system for estimating and compensating for nonlinear distortion in a transmitter using calibration, in accordance with an embodiment of the invention. Referring to FIG. 5, there is shown a transmitter 500. The transmitter 500 may comprise a baseband samples block 502, a scaler block 504, a predistortion block 506, a DAC block 507, a PA block 508, and analog-to-digital converter (ADC) block 510, a scaler block 512 a summation block 514 and a coefficient update calculation block 516. The DAC 507 is substantially similar to the DAC 306 described in FIG. 3. The PA 508 is substantially similar to the PA 312 also described in FIG. 3.

The baseband samples block 502 may comprise suitable logic, circuitry and/or code that may allow generation of a digital baseband signal. The digital baseband signal may comprise a plurality of samples, x. Each of the samples x may represent a complex number.

The scaler block 504 may comprise suitable logic, circuitry and/or code that may enable generation of scaled versions of received input samples x. The scaled samples output from the scaler block 504 may be represented as m·x, where m is a scale factor. In various embodiments of the invention, the value m may vary across a sequence of input samples. In various embodiments of the invention, the scaler block 504 may enable calibration by generating a sequence of scaled samples m·x, which comprise a range of signal amplitudes m·∥x∥. Each of the distinct scaled samples m·x may correspond to a distinct input power level $P_{in}$. The scaled sample sequence may comprise an initial sequence portion, which comprises scaled samples m·x, which correspond to the linear operating range of the PA 508. The maximum signal amplitude for which the PA 508 operates within the linear operating range may be referred to as ∥max_$x_{lin}$∥. Thus, the initial sequence portion may comprise scaled signal amplitudes m·x, which are less than or equal to ∥max_$x_{lin}$∥. The sequence of scaled samples, m·x, may comprise a subsequent sequence portion, which comprises signal amplitudes, which are greater than ∥max_$x_{lin}$∥. The subsequent sequence portion may comprise scaled samples m·x, which correspond to a nonlinear operating range of the PA 508.

Across the range of signal amplitudes x in the sequence, the value of the scale factor may increase by a determined incremental value (or step size), γ, such that:

$$m(t + t_{step}) \cdot \|x(t + t_{step})\| = (1 + \gamma) \cdot m(t) \cdot \|x(t)\| \quad [17]$$

where $t_{step}$ represents a time interval between increments in the value m based on the step size γ, x(t) represents a sample x generated at a time instant t (where each time unit may represent a time interval between generated samples), m(t) represents a scale factor value at the time instant t, m(t+$t_{step}$) represents the scale factor value at the time instant t+$t_{step}$ and x(t+$t_{step}$) represents a sample generated at the time instant t+$t_{step}$. The variable γ represents the iterative algorithm adaptation step size and is chosen to be small enough to enable algorithm convergence.

The predistortion block 506 may comprise suitable logic, circuitry and/or code that may enable generation of predistorted versions of received input samples. When the predistortion block 506 receives as input a sequence of scaled samples m·x, the predistortion block 506 may output a corresponding sequence of predistorted samples m·c·x, where c is a predistortion scale factor. The value of the predistortion scale factor at a time instant t, c(t), may be determined based on the input power level, $P_{in}(t)$, which corresponds to the scaled input sample received at approximately the time instant t. The predistortion block 506 may comprise memory, which may enable storage of predistortion scale values. In an exemplary embodiment of the invention, the predistortion scale values may be stored in a lookup table (LUT).

In various embodiments of the invention, the determined input power level $P_{in}(t)$ may be utilized to determine a value for a predistortion coefficient, $\epsilon$. The predistortion scale factor may then be determined as in the following equation:

$$c = 1 + \epsilon \quad [18]$$

In various embodiments of the invention, the predistortion block 506 may receive, as input, updated predistortion coefficient values corresponding to a current input power level $P_{in}(t)$. The updated predistortion coefficient value may replace the current predistortion coefficient value and may be utilized at a later time instant t' in connection with a received input sample for which $P_{in}(t') = P_{in}(t)$.

The DAC 507 may receive digital predistorted input samples and generate an equivalent predistorted analog signal. The PA 508 may receive a predistorted analog input signal, $RF_{in}$, and generate an amplified analog output signal, $RF_{out}$ as shown in equation [5]. The value of the gain associated with the PA 508, g, may reflect distortions due to AM-AM distortion and/or AM-PM distortion when the PA 508 is operating in a nonlinear operating range.

The ADC 510 may comprise suitable logic, circuitry, and/or code that may enable conversion of an input analog signal to a corresponding output digital signal representation. In various embodiments of the invention, the ADC 510 may receive an analog input signal, $RF_{out}$, and generate a corresponding digital representation, m·c·g·x.

The scaler block 512 may be substantially similar to the scaler block 504. In various embodiments of the invention, the scaler block 512 may receive input samples m·c·g·x, apply a scale factor k/m, and generate output samples k·c·g·x. In an exemplary embodiment of the invention, the value for the scale quantity k may be approximated to the known linear gain of complete transmit and receive path as follows:

$$k = \frac{1}{g_{lin}} \quad [19]$$

where $g_{lin}$ represents the gain factor for the PA 508 when the PA 508 is operating in a linear operating range.

The output from the scaler block 512, m·c·g·x, may be multiplied by the output of the baseband samples block 502, x, to generate a correlation value k·c·g·x². The correlation value may represent a correlation between the samples generated by the baseband samples block 502 and the digital representation of the scaled output signal $RF_{out}$ generated by the PA 508.

The summation block 514 may comprise suitable logic, circuitry and/or code that may enable summation of received input samples, k·c·g·x², over a time duration, $t_{sum}$. In various embodiments of the invention, the summation time duration $t_{sum}$ may correspond to a portion of the time duration, $t_{step}$, during which the value m(t) is constant. In this regard, the summation block 514 may compute an output, which represents a value, k·c·g·$\|x\|^2$, of the received input samples computed over the time duration $t_{sum}$, where x represents values for samples x received over the time duration $t_{sum}$.

In many transmitter systems, the output signal, $RF_{out}$, generated by the PA 508 may contain noise, which was introduced during the process of generating the output signal. The level of noise may be estimated by computing a signal to noise ratio (SNR) for the output signal $RF_{out}$. In various embodiments of the invention, the summation block 514 may enable the computation of a value k·c·g·$\|x\|^2$ for which the SNR may be higher (or improved) relative to one or more of the instantaneous individual samples k·c·g·x² which may be received at the summation block 514 at various time instants across the time duration $t_{sum}$.

The coefficient update calculation block 516 may comprise suitable logic, circuitry and/or code that may enable computation of updated coefficient values $\epsilon_{new}$ based on one or more received computed values k·c·g·$\|x\|^2$. In an exemplary embodiment of the invention, the updated coefficient value may be computed as shown in the following equation:

$$\epsilon_{new} = (Y_0 \cdot Y - Y_0 \cdot Y_0^*) \cdot \gamma + \epsilon_{current} \quad [20]$$

where $Y_0$ represents the value, k·c·g·$\|x\|^2$, which was computed at an amplitude value of the scaled baseband samples m·x for which the PA 508 is operating in the linear operating range. $Y_0^*$ represents the complex conjugate of the complex quantity $Y_0$ and Y represents the value, k·c·g·$\|x\|^2$, which was computed across the current $t_{sum}$ time duration. The variable $\gamma$ represents the step size for increasing the scale factor m. The predistortion coefficient value $\epsilon_{current}$ represents the current value for the predistortion coefficient value, which may be utilized in the current $t_{sum}$ time duration. The expression $(Y_0 \cdot Y - Y_0 \cdot Y_0^*)$ represents a cross-correlation value between the correlation values Y and $Y_0$. The computed value $\epsilon_{new}$ may be communicated to the predistortion block 506, which may replace the current stored predistortion coefficient value, $\epsilon_{current}$, with the updated predistortion coefficient value $\epsilon_{new}$.

In various embodiments of the invention, the transmitter 500 may comprise a calibration method and system, which may enable estimation of non linear distortion within the transmitter 500. The method may also enable computation of predistortion scale factors, which may be utilized to enable compensation for nonlinear distortion within the transmitter. The calibration method may comprise generation of a sequence of samples, x, by the baseband samples block 502. The samples may be scaled by the scaler 504 to generate a sequence of samples at varying amplitude levels and at varying input power levels $P_{in}$. By varying the input power level based on a step size $\gamma$, the PA 508 may generate a range of output signals, $RF_{out}$, when the PA 508 is operating within a linear operating range, and when the PA 508 is operating in a nonlinear operating range. By incrementing the scale value m in small steps $\gamma$, the digitized and scaled output from the PA 508 and the output from the baseband samples block 502 may be utilized to compute a current correlation measure k·c·g·x². The current correlation measure may be computed across a time duration for which the value of the scale factor m is constant. The current computed correlation value and the previously computed correlation value may be utilized to determine an updated value $\epsilon_{new}$ for the predistortion coefficient $\epsilon_{current}$. The updated predistortion coefficient value may be stored as a replacement for $\epsilon_{current}$ in the predistortion block 506. The predistortion block 506 may subsequently utilize the updated value when generating predistorted signals.

In various embodiments of the invention, initial values for the predistortion scale factors stored within the predistortion block 506 may each be equal to 1 for the full range of input power levels. During the calibration process, the stored initial values may be replaced with updated predistortion coefficient values $\epsilon_{new}$ across the range of input power levels. Upon completion of the calibration method, the predistortion block 506 may store a set of predistortion values $\epsilon$, which may be utilized to compute predistortion scale factors, which may in turn enable compensation for nonlinearity in the PA 508 across the range of input power levels.

In various embodiments of the invention, the collocation of circuitry, which enables calibration, and circuitry, which enables compensation for nonlinear distortion in a single IC chip enable the predistortion estimates, determined during the calibration phase, to be subsequently utilized to compensate for nonlinear distortion in the transmitter 500 during normal operation. In an exemplary aspect of the invention, the coefficient update calculation block 516 may compute updated values for the predistortion coefficient $\epsilon_{new}$. The updated predistortion coefficient value may be communicated to the predistortion block 506, wherein the updated predistortion coefficient value may be stored. The predistortion block 506 may subsequently utilize the updated predistortion coefficient to predistort subsequent baseband samples.

Figure 6:
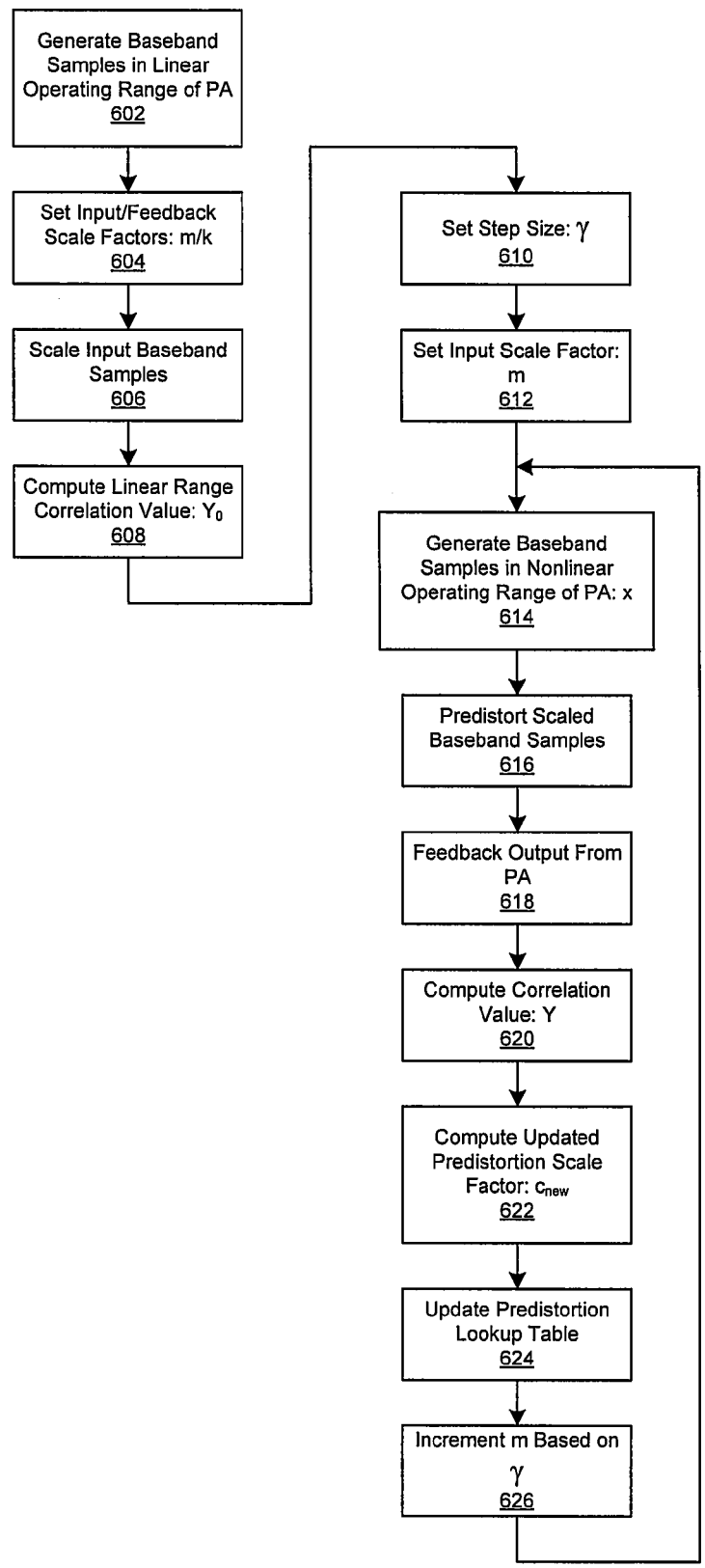
FIG. 6 is a flowchart illustrating exemplary steps for estimating and compensating for nonlinear distortion in a transmitter, in accordance with an embodiment of the invention.

FIG. 6 is a flowchart illustrating exemplary steps for estimating and compensating for nonlinear distortion in a transmitter, in accordance with an embodiment of the invention. Referring to FIG. 6, steps 602-608 present steps for establishing a reference correlation value $Y_0$, which may be computed when the PA 508 is operating in a linear operating range. In step 602, the baseband samples block 502 may generate samples, x, for which the PA 508 is operating in the linear operating range. In step 604, the processor 125 may configure the scaler 504 with a selected input scale factor, m, and the scaler 512 with a selected output scale factor k. In step 606, the scaler 504 may scale the input baseband samples x. In step 608, the summation block 514 may compute a correlation value $Y_0$, which corresponds to the linear operating range of the PA 508.

Steps 610-626 present steps for updating predistortion scale factors for input baseband samples when the PA 508 is operating in a nonlinear operating range. In step 610, a step size $\gamma$ may be selected by the processor 125. In step 612, an input scale factor corresponding to the current input power level, $P_{in}$, may be selected by the processor. In step 614, the baseband samples block 502 may generate baseband samples, x, for which the PA 508 may operate in a nonlinear operating range. In step 616, the predistortion block 506 may predistort scaled baseband samples received from the scaler block 504. The predistortion scale factor, c, may be determined based on the $P_{in}$ value by reference to an LUT.

In step 618, the output signal from the PA 508 may be utilized as a feedback signal. The current feedback signal may be converted from analog to digital format and scaled by the scaler 512. In step 620, the current scaled output value may be multiplied by the input baseband sample to generate a correlation value. A variable Y may be generated by summing a plurality of samples of the correlation value. In step 622, the values Y, $Y_o$, and $\gamma$ may be utilized to compute an updated predistortion scale factor c.sub.new. The new predistortion scale factor may be utilized to update the LUT within the predistortion block 506 in step 624. In step 626, the value of the input scale factor m, may be incremented based on the value $\gamma$. Step 614 may follow step 626.

Aspects of a system for estimating and compensating for non-linear distortion in a transmitter using calibration may include one more circuits that may enable estimation, within a single IC device, of distortion in output signals generated by a transmitter circuit 500. The circuitry may enable compensation of the estimated distortion by predistorting subsequent input signals. The transmitter circuit 500 may generate subsequent output signals based on the predistorted subsequent input signals. The estimated distortion may comprise amplitude distortion (such as AM-AM distortion) and/or phase distortion (such as AM-PM distortion). A predistortion scale factor, c, may be computed that enables the predistortion of the subsequent input signals. The predistortion scale factor may be computed as shown in equation [18]. The predistortion coefficient value may be computed as shown in equation [20].

Another embodiment of the invention may provide a machine-readable storage, having stored thereon, a computer program having at least one code section executable by a machine, thereby causing the machine to perform the steps as described herein for estimating and compensating for non-linear distortion in a transmitter using calibration.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals in a wireless communications system, the method comprising:
   estimating, within a single integrated circuit (IC) device comprising a transmitter circuit, distortion in output signals caused by said transmitter circuit;
   computing a reference correlation value based on calibration input signals and corresponding calibration output signals, wherein a signal level of said calibration input signals is within a linear operating range for said transmitter circuit;

adjusting an amplitude of said calibration input signals to generate subsequent calibration input signals, wherein a signal level of said subsequent calibration input signals is within a nonlinear operating range for said transmitter circuit;

computing a subsequent correlation value based on said subsequent calibration input signals and corresponding subsequent calibration output signals; and predistorting based on said computed reference correlation value and said computed subsequent correlation value, an input signal within said single IC device to compensate for said estimated distortion.

2. The method according to claim 1, comprising computing a predistortion scale factor that enables said predistorting said input signal.

3. The method according to claim 2, wherein said predistortion scale factor is computed by computing a sum comprising the number one (1) and a predistortion coefficient value based on said computed reference correlation value.

4. The method according to claim 1, wherein adjusting said amplitude is performed based on a step size parameter.

5. The method according to claim 4, comprising:
computing a cross-correlation value based on said reference correlation value and said subsequent correlation value.

6. The method according to claim 5, comprising:
scaling said computed cross-correlation value based on said step size parameter; and
adding said scaled said computed cross-correlation value and a preceding value for said predistortion coefficient value.

7. The method according to claim 4, wherein said subsequent correlation value comprises a value, which is computed across a plurality of samples of said input signal.

8. The method according to claim 1, wherein said reference correlation value comprises a value, which is computed across a plurality of samples of said calibration input signals.

9. The method according to claim 1, wherein said estimated distortion comprises amplitude distortion and/or phase distortion.

10. A machine-readable storage having stored thereon, a computer program having at least one code section for processing signals in a wireless communications system, the at least one code section being executable by a machine for causing the machine to perform steps comprising:

estimating, within a single integrated circuit (IC) device comprising a transmitter circuit, distortion in output signals caused by said transmitter circuit;

computing a reference correlation value based on calibration input signals and corresponding calibration output signals, wherein a signal level of said calibration input signals is within a linear operating range for said transmitter circuit;

adjusting an amplitude of said calibration input signals to generate subsequent calibration input signals, wherein a signal level of said subsequent calibration input signals is within a nonlinear operating range for said transmitter circuit;

computing a subsequent correlation value based on said subsequent calibration input signals and corresponding subsequent calibration output signals; and predistorting based on said computed reference correlation value and said computed subsequent correlation value, an input signal within said single IC device to compensate for said estimated distortion.

11. The machine-readable storage according to claim 10, wherein said at least one code section enables computing a predistortion scale factor that enables said predistorting said input signal.

12. The machine-readable storage according to claim 11, wherein said predistortion scale factor is computed by computing a sum comprising the number one (1) and a predistortion coefficient value based on said computed reference correlation value.

13. The machine-readable storage according to claim 10, wherein adjusting said amplitude is performed based on a step size parameter.

14. The machine-readable storage according to claim 13, wherein said at least one code section enables:
computing a cross-correlation value based on said reference correlation value and said subsequent correlation value.

15. The machine-readable storage according to claim 14, wherein said at least one code section enables:
scaling said computed cross-correlation value based on said step size parameter; and
adding said scaled said computed cross-correlation value and a preceding value for said predistortion coefficient value.

16. The machine-readable storage according to claim 13, wherein said subsequent correlation value comprises a value, which is computed across a plurality of samples of said input signal.

17. The machine-readable storage according to claim 10, wherein said reference correlation value comprises a value, which is computed across a plurality of samples of said calibration input signals.

18. The machine-readable storage according to claim 10, wherein said estimated distortion comprises amplitude distortion and/or phase distortion.

19. A system for processing signals in a wireless communications system, the system comprising:
one or more circuits that enable estimation, within a single integrated circuit (IC) device comprising a transmitter circuit, of distortion in output signals caused by said transmitter circuit;

said one or more circuits enable computation of a reference correlation value based on calibration input signals and corresponding calibration output signals, wherein a signal level of said calibration input signals is within a linear operating range for said transmitter circuit;

said one or more circuits enable computation of a predistortion coefficient value based by adjusting an amplitude of said calibration input signals to generate subsequent calibration input signals, wherein a signal level of said subsequent calibration input signals is within a nonlinear operating range for said transmitter circuit; and computing a subsequent correlation value based on said subsequent calibration input signals and corresponding subsequent calibration output signals;

said one or more circuits enable predistortion based on said computed reference correlation value and said computed subsequent correlation value, of an input signal within said single IC device to compensate for said estimated distortion.

20. The system according to claim 19, wherein said one or more circuits that enable computing of a predistortion scale factor that enables said predistorting said input signal.

21. The system according to claim 20, wherein said predistortion scale factor is computed by computing a sum comprising the number one (1) and said predistortion coefficient value based on said computed reference correlation value.

22. The system according to claim 19, wherein adjusting said amplitude is performed based on a step size parameter.

23. The system according to claim 22, wherein said one or more circuits that enable computation of said predistortion coefficient value based by: computing a cross-correlation value based on said reference correlation value and said subsequent correlation value.

24. The system according to claim 23, wherein said one or more circuits that enable computation of said predistortion coefficient value based by:

scaling said computed cross-correlation value based on said step size parameter; and adding said scaled said computed cross-correlation value and a preceding value for said predistortion coefficient value.

25. The system according to claim 22, wherein said subsequent correlation value comprises a value, which is computed across a plurality of samples of said input signal.

26. The system according to claim 19, wherein said reference correlation value comprises a value, which is computed across a plurality of samples of said calibration input signals.

27. The system according to claim 19, wherein said estimated distortion comprises amplitude distortion and/or phase distortion.

* * * * *